(12) United States Patent
Yamazaki et al.

(10) Patent No.: US 7,545,879 B2
(45) Date of Patent: Jun. 9, 2009

(54) DEMODULATION CIRCUIT AND ELECTRONIC DEVICE

(75) Inventors: Daisuke Yamazaki, Kawasaki (JP); Andrzej Radecki, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 11/892,699

(22) Filed: Aug. 27, 2007

(65) Prior Publication Data

US 2007/0291879 A1 Dec. 20, 2007

Related U.S. Application Data

(63) Continuation of application No. PCT/JP2005/003342, filed on Feb. 28, 2005.

(51) Int. Cl.
*H04L 25/34* (2006.01)
(52) U.S. Cl. ...................................... 375/287
(58) Field of Classification Search ................. 375/261, 375/286, 287, 293, 324–325, 340, 342, 264
See application file for complete search history.

(56) References Cited

U.S. PATENT DOCUMENTS

| | | | |
|---|---|---|---|
| 5,237,589 A * | 8/1993 | Hayakawa et al. | 375/287 |
| 5,425,053 A * | 6/1995 | Matsumoto | 375/287 |
| 5,703,505 A * | 12/1997 | Kwon | 327/75 |
| 5,832,038 A * | 11/1998 | Carsello | 375/316 |
| 5,898,734 A | 4/1999 | Nakamura et al. | |
| 6,034,620 A * | 3/2000 | Ikka | 340/7.1 |
| 6,271,690 B1 | 8/2001 | Hirano et al. | |
| 7,308,045 B2 * | 12/2007 | Kubota | 375/317 |
| 2003/0128070 A1 | 7/2003 | Rizzo et al. | |

FOREIGN PATENT DOCUMENTS

| | | |
|---|---|---|
| EP | 1 039 644 A2 | 9/2000 |
| JP | 09-205466 | 8/1997 |
| JP | 10-261940 | 9/1998 |
| JP | 2000-349605 | 12/2000 |
| JP | 2003-528541 A | 9/2003 |
| JP | 2006-005651 | 1/2006 |

\* cited by examiner

*Primary Examiner*—Khanh C Tran
(74) *Attorney, Agent, or Firm*—Arent Fox LLP

(57) ABSTRACT

To be capable of receiving many data without increasing a transfer speed. A wave detector detects a radio signal RF received by an antenna. The radio signal RF received by the antenna has been subjected to ASK modulation, for example, and by getting it through a lowpass filter or the like, an envelope (multilevel signal) that is a basis of received data D0, D1 is obtained. An amplitude detector detects the maximum value and the minimum value of the amplitude of the multilevel signal. A threshold calculator calculates a plurality of thresholds to be used for determining whether the multilevel signal is H state or L state, from the maximum value and the minimum value detected by the amplitude detector. A multilevel restoration unit compares the multilevel signal with each of the thresholds to detect the H state and the L state, and reconstructs a plurality of received data D0 to Dn.

19 Claims, 10 Drawing Sheets

DEMODULATION CIRCUIT AND ELECTRONIC DEVICE

This application is a continuing application, filed under 35 U.S.C. § 111(a), of International Application PCT/JP2005/003342, filed Feb. 28, 2005.

BACKGROUND

1. Field

This embodiment relates to a demodulation circuit and an electronic device, and more particularly, to a demodulation circuit for demodulating multilevel signals received on radio and an electronic device for receiving on radio and demodulating multilevel signals.

2. Description of Related Art

Non-contact data carriers including non-contact IC cards and non-contact ID chips, which do not contain power sources such as batteries, obtain electric power from radio wave energy emitted from reader/writer devices, and at the same time perform data communication by using the radio waves. Therefore, the non-contact data carriers and the reader/writer devices have modulation circuits for modulating data and demodulation circuits for demodulating data.

The demodulation circuits installed in the non-contact data carriers and the reader/writer devices calculate from a received signal a threshold to be used for determining whether the received signal is H level or L level. Based on the threshold, the demodulation circuits obtain prescribed received data from the received signal.

FIG. 10 is a view showing circuit blocks of a demodulation circuit to be used in a non-contact data carrier. As shown in this figure, the demodulation circuit has a wave detector 101, a maximum/minimum detector 102, an intermediate value calculator 103, and a comparator 104.

The wave detector 101 detects a radio signal RF received by an antenna. The radio signal RF received by the antenna has been subjected to ASK modulation, for example. By getting the radio signal RF through a lowpass filter or the like, an envelope that is a basis of received data D0 is obtained. The maximum/minimum detector 102 detects the maximum value and the minimum value of the signal received from the wave detector 101. The intermediate value calculator 103 calculates a threshold to be used for determining whether the received radio signal RF is H level or L level, from the maximum value and the minimum value detected by the maximum/minimum detector 102. For example, a threshold is calculated by adding the maximum value and the minimum value and dividing the result by two. The comparator 104 detects L state and H state depending on whether the signal received from the wave detector 101 is greater than the threshold calculated by the intermediate value calculator 103. Then, the received data D0 of the detected L state and H state is output to a circuit of latter stage.

It should be noted that there exists an automatic threshold value control circuit for always playing digital signals completely, irrespective of amplitude fluctuation and fluctuation of direct current level of signals. (For example, refer to JP 10-261940 A).

SUMMARY

The embodiment provides that a demodulation circuit restoring a multilevel signal received on radio including an amplitude detector detecting a maximum value and a minimum value of an amplitude of the multilevel signal, a threshold calculator calculating a plurality of thresholds to be used for determining whether the multilevel signal is H sate or L state, from the maximum value and the minimum value, and a multilevel restoration unit comparing the multilevel signal with each of the thresholds to detect the H state and the L state, and reconstructing a plurality of received data.

DETAILED DESCRIPTION OF THE EMBODIMENTS

By the way, in order to transmit and receive many data, a data transfer speed should be set high. However, a high transfer speed causes spurious, which in turn affects other electronic devices. Therefore, there is a demand for demodulation circuits capable of receiving many data without increasing a transfer speed.

The embodiment has been made in view of foregoing and intends to provide a demodulation circuit and an electronic device that are capable of demodulating multilevel signals to receive many data, without increasing a transfer speed.

Means for Solving Problems

Figure 1:
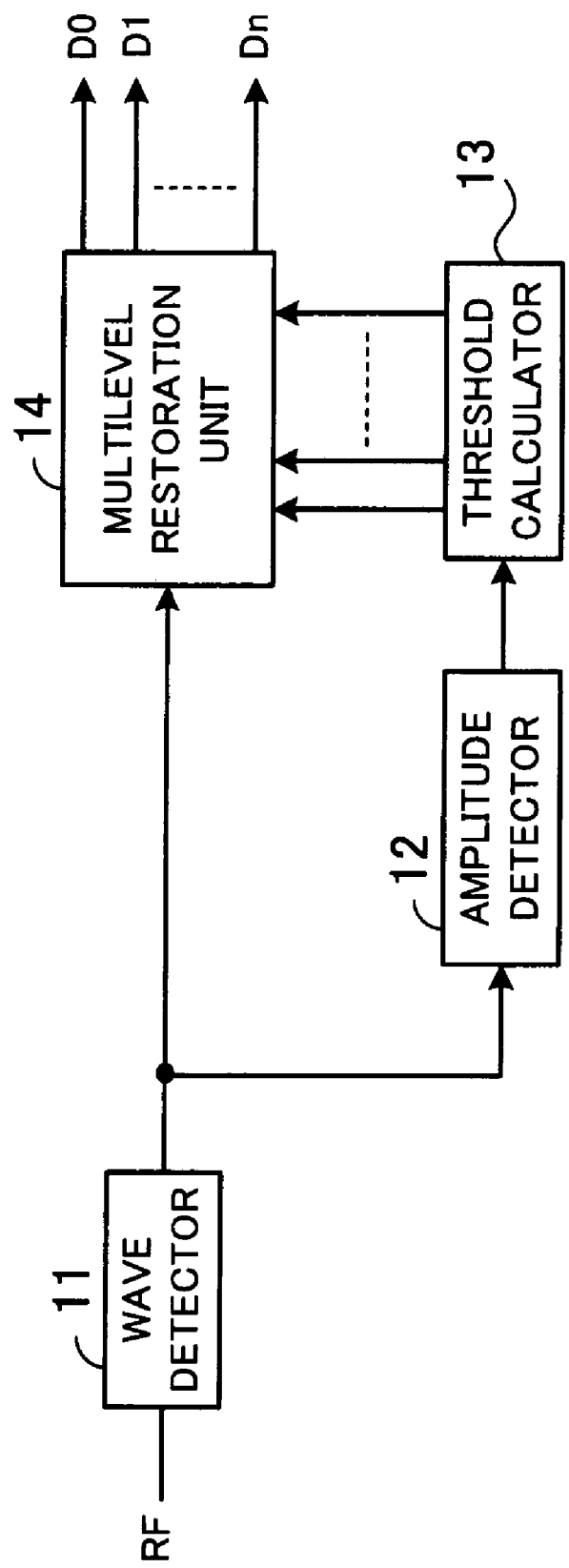
[FIG. 1] A block diagram of a configuration of a demodulation circuit according to one embodiment.

In order to solve the above problems, the embodiment proposes a demodulation circuit for restoring multilevel signals received on radio, as shown in FIG. 1. This demodulation circuit comprises an amplitude detector 12 for detecting the maximum value and the minimum value of the amplitude of a multilevel signal, a threshold calculator 13 for calculating a plurality of thresholds to be used for determining whether the multilevel signal is H state or L state, from the maximum value and the minimum value, and a multilevel restoration unit 14 for comparing the multilevel signal with each threshold to detect the H state and the L state and reconstructing a plurality of received data D0 to Dn.

According to such a demodulation circuit, thresholds to be used for reconstructing received data D0 to Dn are calculated from the maximum value and the minimum value of a multilevel signal, the multilevel signal and the threshold voltages are compared, and the received data D0 and D1 are reconstructed.

According to the demodulation circuit of the embodiment, thresholds to be used for reconstructing received data are calculated from the maximum value and the minimum value of a multilevel signal, the multilevel signal and the threshold voltages are compared, and the received data is reconstructed. Therefore, many data can be received without increasing a transfer speed.

The above and other objects, features and advantages of the embodiment will become apparent from the following description when taken in conjunction with the accompanying drawings which illustrate preferred embodiments by way of example.

Hereinafter, one embodiment will be described in detail with reference to accompanying drawings.

FIG. 1 is a block diagram of a configuration of a demodulation circuit according to one embodiment. As shown in this figure, the demodulation circuit comprises a wave detector 1, an amplitude detector 12, a threshold calculator 13, and a multilevel restoration unit 14. The illustrated demodulation circuit is installed in a non-contact data carrier such as a non-contact IC card or a non-contact ID chip, or a reader/writer device, and is designed to demodulate received multilevel signals transmitted on radio.

The wave detector 11 detects a radio signal RF received by an antenna. The radio signal RF received by the antenna has been subjected to ASK modulation, for example, and by getting the radio signal RF through a lowpass filter or the like, an envelope (multilevel signal) that is a basis of received data D0 to Dn is obtained. The wave detector 11 outputs the multilevel signal as electric current or voltage to the amplitude detector 12 and the multilevel restoration unit 14. In the following description, it is assumed that the wave detector 11 outputs the multilevel signal as electric current.

Figure 2:
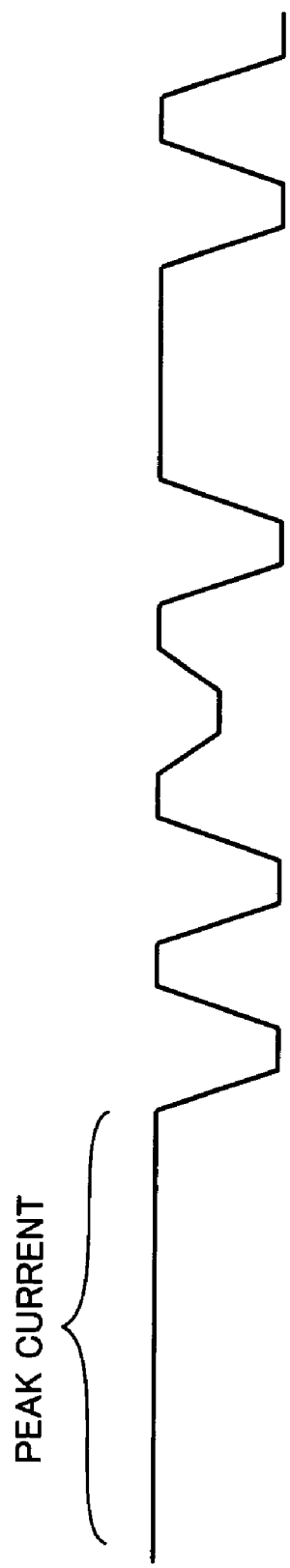
[FIG. 2] A view showing a multilevel signal output from a wave detector.

By the way, before signal transmission starts, for example, when an IC card and a reader/writer device come close to each other to get ready for communication, a multilevel signal continues its peak current, and then becomes a signal including information. FIG. 2 is a view showing a multilevel signal output from the wave detector. As shown in this figure, the multilevel signal continues its peak current before signal transmission starts. Then, the signal becomes a signal including information. It is assumed that the multilevel signal has a positive current value.

Referring back to FIG. 1. The amplitude detector 12 detects the maximum value and the minimum value of the amplitude of the multilevel signal received from the wave detector 11.

The threshold calculator 13 calculates thresholds to be used for reconstructing received data from the multilevel signal, from the maximum value and the minimum value of the amplitude of the multilevel signal detected by the amplitude detector 12. For example, in the case where the multilevel signal is an N-level signal, thresholds are calculated from the maximum value and the minimum value so that the amplitude of the multilevel signal is divided into N (N is a positive integral number of three or greater).

The multilevel restoration unit 14 compares the multilevel signal received from the wave detector 11 with each threshold received from the threshold calculator 13. Then, depending on whether the electric current of the multilevel signal is the threshold or greater, information indicating H state or L state is obtained from the multilevel signal, and the received data D0, D1, . . . , Dn included in the multilevel signal is reconstructed.

Now, reconstruction of received data from a multilevel signal will be described with reference to views of signal waveforms.

Figure 3:
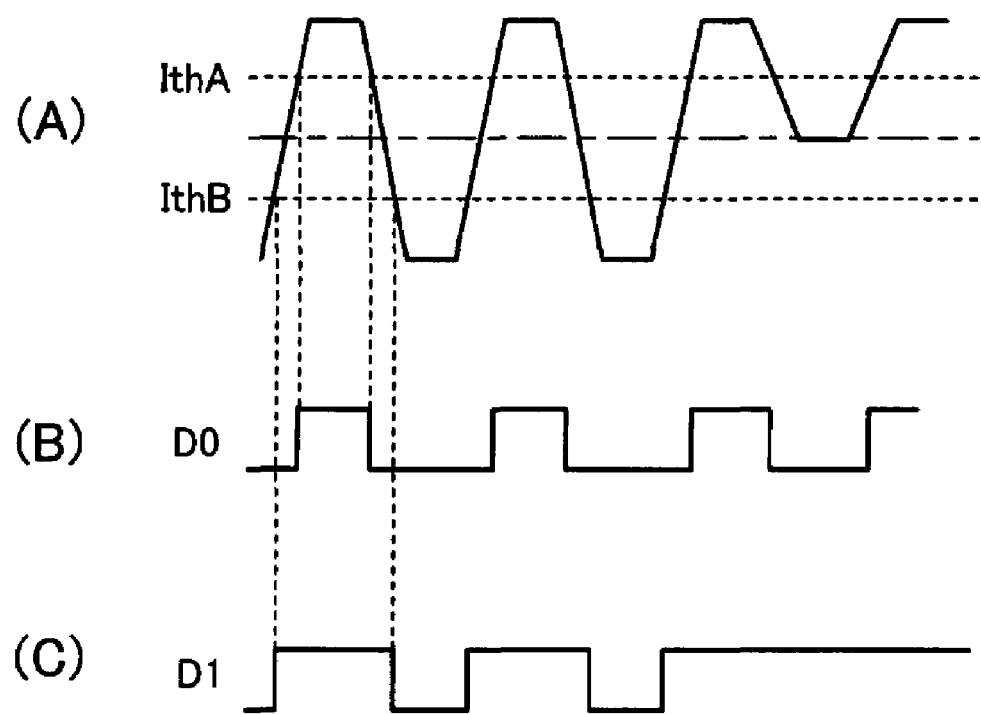
[FIG. 3] Views for explaining how to reconstruct received data from a multilevel signal.

FIG. 3 is views for explaining how to reconstruct received data from a multilevel signal. The figure (A) shows the waveform of a three-level signal (hereinafter, the three-level signal is used for this explanation) output from the wave detector 11. As shown in this figure, in the case of three-level signal, there is an intermediate level in addition to levels corresponding H state and L state. The figures (B) and (C) show received data D0 and D1 output from the multilevel restoration unit 14.

The amplitude detector 12 detects the maximum value and the minimum value of the amplitude of the multilevel signal shown in the figure (A). The threshold calculator 13 calculates a center of the amplitude from the maximum value and the minimum value of the amplitude of the multilevel signal detected by the amplitude detector 12. Then a center between the center of the amplitude and the maximum value of the amplitude is calculated to thereby calculate a threshold IthA. In addition, a center between the center of the amplitude and the minimum value of the amplitude is calculated to thereby calculate a threshold IthB. That is, the thresholds are calculated so that the amplitude of the multilevel signal is divided into three with the thresholds IthA and IthB as boarders. In the case of an N-level signal, its amplitude is divided in the same way to thereby obtain N−1 thresholds.

The multilevel restoration unit 14 compares the threshold IthA received from the threshold calculator 13 with the multilevel signal and outputs the received data D0 shown in the figure (B). For example, if the electric current of the multilevel signal is greater than the threshold IthA, the multilevel signal is identified as being H state, and if the electric current of the multilevel signal is smaller than the threshold IthA, the multilevel signal is identified as being L state, with the result that the received data D0 shown in the figure (B) is output. In addition, the multilevel restoration unit 14 compares the threshold IthB received from the threshold calculator 13 with the multilevel signal, and outputs the received data D1 shown in the figure (C). For example, if the electric current of the multilevel signal is greater than the threshold IthB, the multilevel signal is identified as being H state, and if the electric current of the multilevel signal is smaller than the threshold IthB, the multilevel signal is identified as being L state, with the result that the received data D1 shown in the figure (C) is output.

As described above, the thresholds to be used for reconstructing received data are calculated from the maximum value and the minimum value of the multilevel signal, and the multilevel signal is compared with the threshold voltages, to thereby reconstruct received data. Therefore, many data can be received without increasing a transfer speed.

In addition, thresholds are dynamically calculated from the maximum value and the minimum value of the multilevel signal, so that, even if a modulation rate of an radio signal RF input to the wave detector 11 varies, stable demodulation can be performed.

It should be noted that a multilevel signal may be a signal obtained by modulating Manchester codes.

Now, another embodiment of embodiment of FIG. 4 will be described in detail with reference to accompanying drawings. In another embodiment, a multilevel signal is made to have an amplitude of binary, a maximum value and a minimum value, the minimum value is obtained from this binarized multilevel signal, and thresholds are calculated.

Figure 4:
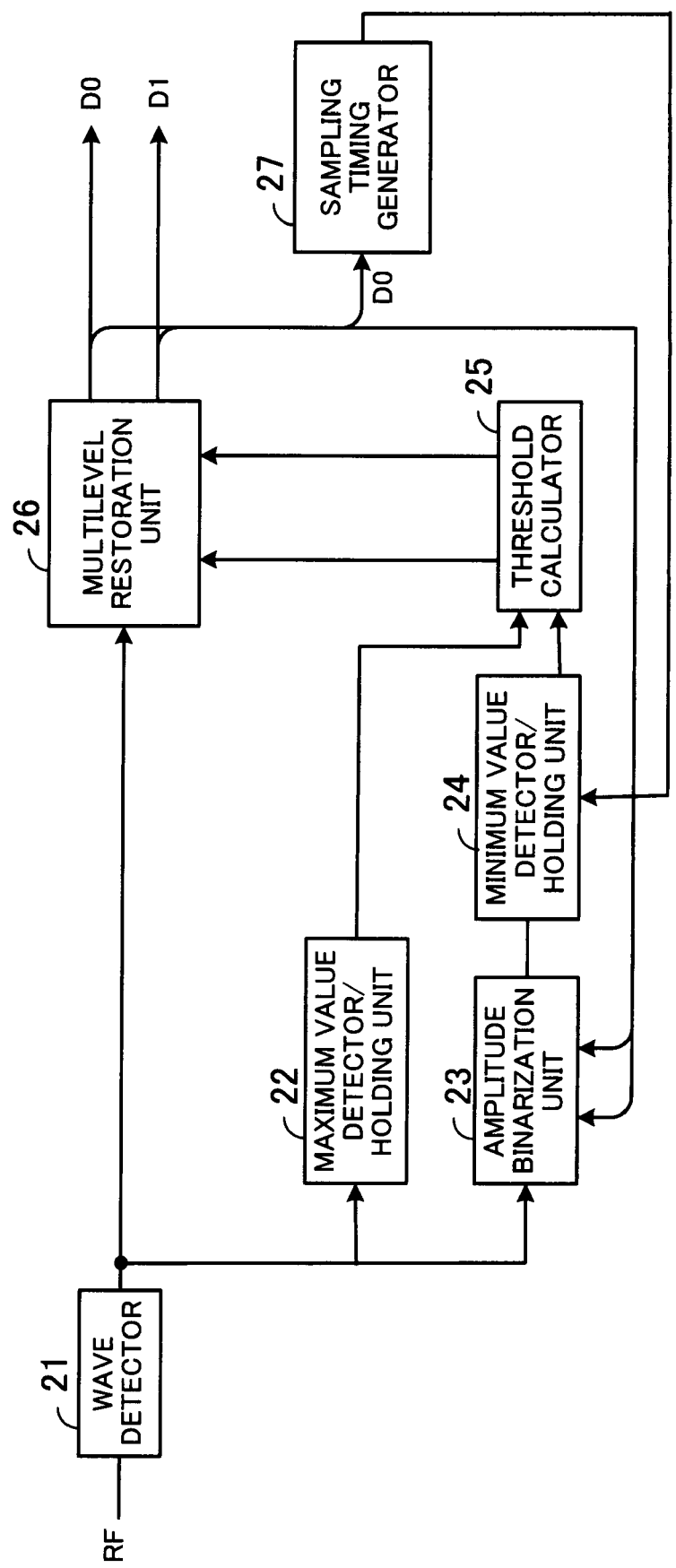
[FIG. 4] A block diagram of a configuration of a demodulation circuit according to another embodiment.

FIG. 4 is a block diagram of a configuration of a demodulation circuit according to another embodiment of FIG. 4. As shown in this figure, the demodulation circuit comprises a wave detector 21, a maximum value detector/holding unit 22, an amplitude binarization unit 23, a minimum value detector/holding unit 24, a threshold calculator 25, a multilevel restoration unit 26, and a sampling timing generator 27.

The wave detector 21 obtains a multilevel signal from a radio signal. RF received by an antenna, as in the wave detector 11 described with FIG. 1. The multilevel signal is output to the maximum value detector/holding unit 22, the amplitude binarization unit 23, and the multilevel restoration unit 26.

The maximum value detector/holding unit 22 detects and holds the maximum value of the electric current of the multilevel signal received from the wave detector 21. The maximum value detector/holding unit 22 outputs the held maximum value of the electric current of the multilevel signal to the threshold calculator 25.

The amplitude binarization unit 23 causes the amplitude of the multilevel signal received from the wave detector 21 to have the maximum value and the minimum value alternately. For example, even if a multilevel signal (here, a three-level signal) of intermediate level is output, a level corresponding to the maximum value and a level corresponding to the minimum value are alternately output. In addition, even if the multilevel signal continues its maximum value, the maximum value level and the minimum value level are always output alternately.

The amplitude binarization unit 23 receives received data D0 and D1 from the multilevel restoration unit 26, and depending on the H state and L state of the received data D0 and D1, recognizes that the multilevel signal output from the wave detector 21 is intermediate level, and also recognizes that the multilevel signal output from the wave detector 21 continues its maximum value.

The minimum value detector/holding unit 24 detects and holds the minimum value of the electric current of the multilevel signal received from the amplitude binarization unit 23. The minimum value detector/holding unit 24 outputs the held minimum value of the multilevel signal to the threshold calculator 25. The minimum value detector/holding unit 24 holds the minimum value of the electric current of the binarized multilevel signal received from the amplitude binarization unit 23, in accordance with a timing signal coming from the sampling timing generator 27 that will be described later.

The threshold calculator 25 calculates thresholds to be used for reconstructing received data D0 and D1 from the multilevel signal, from the maximum value of the amplitude of the multilevel signal received from the maximum value detector/holding unit 22 and the minimum value of the amplitude of the multilevel signal received from the minimum value detector/holding unit 24, as in the threshold calculator 13 described with FIG. 1.

The multilevel restoration unit 26 compares the multilevel signal received from the wave detector 11 with each threshold received from the threshold calculator 13, as in the multilevel restoration unit 14 described with FIG. 1. Then the multilevel restoration unit 26 obtains information indicating H state and L state, included in the multilevel signal, depending on whether the electric current of the multilevel signal is greater than the thresholds, and reconstructs the received data D0 and D1 included in the multilevel signal.

The sampling timing generator 27 receives the received data D0 from the multilevel restoration unit 26. The sampling timing generator 27 generates a timing signal of a fixed period based on the received data D0.

Now, reconstruction of received data from a multilevel signal will be described with reference to views of signal waveforms.

Figure 5:
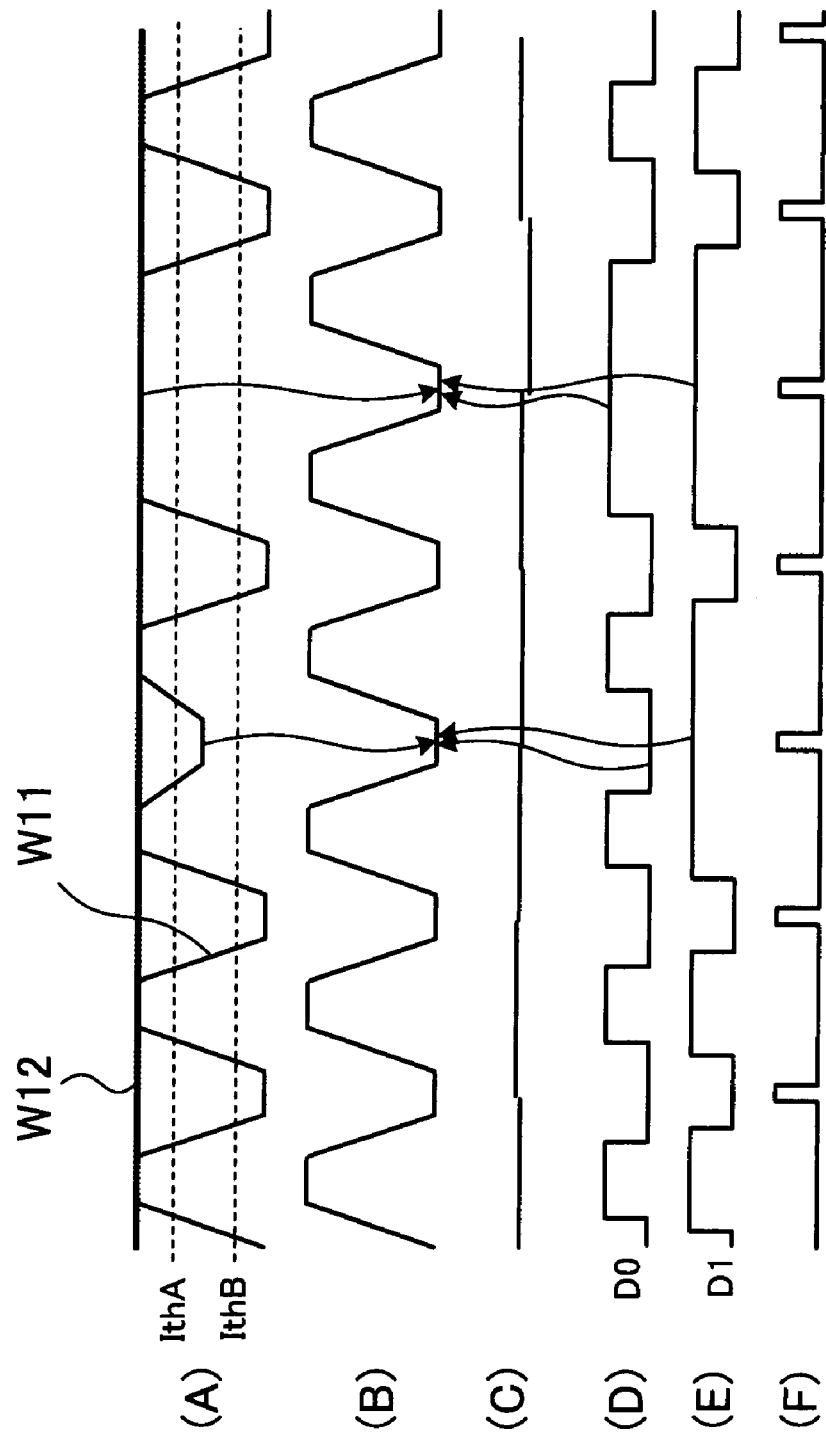
[FIG. 5] Views for explaining how to reconstruct received data from a multilevel signal.

FIG. 5 is views for explaining how to reconstruct received data from a multilevel signal. A waveform W11 of the figure (A) is a waveform of a three-level signal output from the wave detector 21. In the case of three-level signal, there is an intermediate level in addition to levels corresponding to H state and L state, as shown in this figure. In addition, a waveform W12 of the figure (A) shows the maximum value of the amplitude of the multilevel signal. That is, the maximum value detector/holding unit 22 holds the electric current value shown by the waveform W12, and outputs the same to the threshold calculator 25. The figure (B) shows a waveform obtained by binarizing the waveform W11 of the figure (A) into an amplitude of the maximum value and the minimum value. That is, the figure (B) shows the electric current value that is output from the amplitude binarization unit 23. The figure (C) shows the minimum current value of the multilevel signal held by the minimum value detector/holding unit 24. The figure (D) shows received data D0 output from the multilevel restoration unit 26. The figure (E) shows received data D1 output from the multilevel restoration unit 26. The figure (F) shows a timing signal output from the sampling timing generator 27.

From the wave detector 21 of FIG. 4, a multilevel signal shown by the waveform W11 of the figure (A) is output. The maximum value detector/holding unit 22 holds the maximum value of the multilevel signal received from the wave detector 21, which is shown by the waveform W12 of the figure (A), and outputs the same to the threshold calculator 25.

The amplitude binarization unit 23 binarizes the multilevel signal that outputs intermediate level and H state continuously, as shown in the figure (B), and outputs the resultant to the minimum value detector/holding unit 24. In the case where the received data D0 is L state and the received data D1 is H state, as shown by arrows of this figure, the amplitude binarization unit 23 recognizes that the multilevel signal is intermediate level, and in this case, it causes the multilevel signal to have the minimum value. In addition, in the case where the received data D0 and D1 continue their H states, as shown by arrows of this figure, the amplitude binarization unit 23 recognizes that the multilevel signal continues its H state, and in this case, it causes the multilevel signal to have the minimum value so as not to continue the H state. In order to obtain the minimum value of the amplitude from the intermediate level, a difference between the maximum value and the intermediate level is calculated, and a doubled value of the difference is subtracted from the maximum value, thereby calculating the minimum value, for example. In addition, in order to obtain the minimum value of the amplitude from the maximum value, the maximum value is multiplied by a predetermined value (one or smaller), thereby calculating the minimum value, for example.

The minimum value detector/holding unit 24 holds the minimum value of the binarized multilevel signal, which is shown in the figure (C), and outputs the same to the threshold calculator 25, in accordance with a timing signal coming from the sampling timing generator 27 shown in the figure (F).

The threshold calculator 25 calculates thresholds IthA and IthB shown in the figure (A), from the maximum value of the amplitude of the multilevel signal received from the maximum value detector/holding unit 22 and the minimum value of the amplitude of the multilevel signal received from the minimum value detector/holding unit 24.

The multilevel restoration unit 26 compares the threshold IthA received from the threshold calculator 25 with the multilevel signal, and outputs the received data D1 shown in the figure (D). In addition, the multilevel restoration unit 26 compares the threshold IthB received from the threshold calculator 25 with the multilevel signal, and outputs the received data D0 shown in the figure (E).

The sampling timing generator 27 has a counter, and when a prescribed number is counted after the received data D0 falls, outputs a timing signal of pulse width much smaller than the pulse width of the received data D0, which is shown in the figure (F). If the received data D0 continues its H state, the sampling timing generator 27 periodically outputs a timing signal with reference to a last count value.

As described above, in the case where a multilevel signal continues its intermediate level and H state, the multilevel signal is binarized to accurately obtain the minimum value of the multilevel signal, so that the received data D0 and D1 can be reconstructed. Therefore, many data can be completely received without increasing a transfer speed.

Now, another embodiment of FIG. 6 will be described in detail with reference to accompanying drawings. In another embodiment of FIG. 6, the electric current of a multilevel signal output from a wave detector is made to have a minimum value of zero, thereby simplifying signal processing of a circuit.

Figure 6:
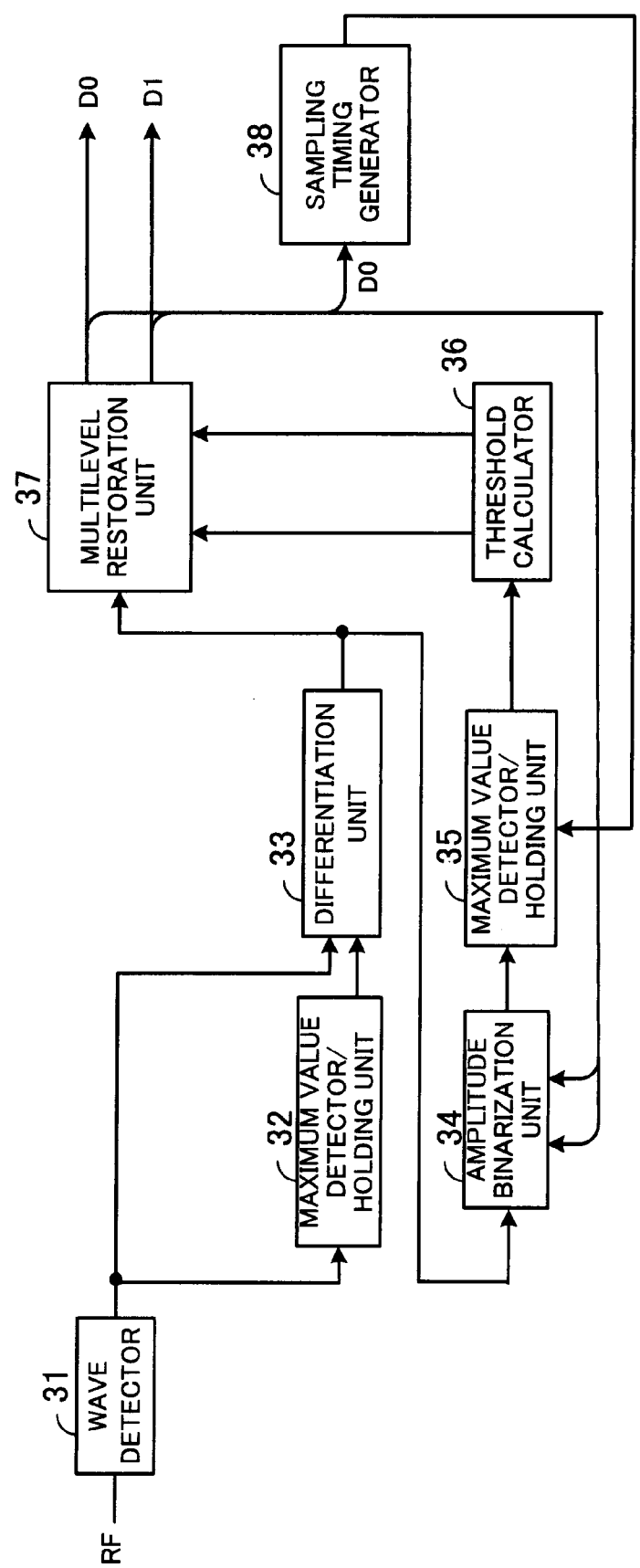
[FIG. 6] A block diagram of a configuration of a demodulation circuit according to another embodiment.

FIG. 6 is a block diagram of a configuration of a demodulation circuit according to another embodiment. As shown in FIG. 6, the demodulation circuit comprises a wave detector 31, a maximum value detector/holding unit 32, a differentiation unit 33, an amplitude binarization unit 34, a maximum value detector/holding unit 35, a threshold calculator 36, a multilevel restoration unit 37, and a sampling timing generator 38.

The wave detector 31 obtains a multilevel signal from a radio signal RF received by an antenna, as in the wave detector 11 described with FIG. 1. The multilevel signal is output to the maximum value detector/holding unit 32 and the differentiation unit 33.

The maximum value detector/holding unit 32 detects and holds the maximum value of the electric current of the multilevel signal received from the wave detector 31. The maximum value detector/holding unit 32 outputs the held maximum value of the electric current of the multilevel signal to the differentiation unit 33.

The differentiation unit 33 subtracts the multilevel signal received from the wave detector 31 from the maximum value of the electric current of the multilevel signal held by the maximum value detector/holding unit 32, and outputs the resultant. Thereby the multilevel signal to be output from the differentiation unit 33 is a reversed signal of the multilevel signal and has a minimum current value of zero. By causing the multilevel signal to have zero as the electric current of the minimum level, signal processing to be performed by a circuit of latter stage is simplified. The reversed multilevel signal from the differentiation unit 33 is output to the amplitude binarization unit 34 and the multilevel restoration unit 37.

The amplitude binarization unit 34 binarizes the reversed multilevel signal received from the differentiation unit 33, based on the received data D0 and D1 received from the multilevel restoration unit 37, as in the amplitude binarization unit 23 of FIG. 4. That is, even if the multilevel signal (a three-level signal is used for this explanation) of intermediate level is output, the amplitude binarization unit 34 always outputs a level corresponding to H state and a level corresponding to L state alternately. In addition, even if the multilevel signal continues its minimum value, the amplitude binarization unit 34 always outputs the maximum value level and the minimum value level alternately.

The maximum value detector/holding unit 35 detects and holds the maximum value of the multilevel signal received from the amplitude binarization unit 34. The multilevel signal has been reversed by the differentiation unit 33 and its electric current of minimum level is zero, as described above, so that the maximum value is to be held here. The maximum value detector/holding unit 35 holds the maximum value of the electric current of the binarized multilevel signal received from the amplitude binarization unit 34, in accordance with a timing signal coming from the sampling timing generator 38 that will be described later.

The threshold calculator 36 calculates thresholds to be used for reconstructing received data D0 and D1 from a multilevel signal, from the maximum value of the amplitude of the multilevel signal received from the maximum value detector/holding unit 35, as in the threshold calculator 13 described with FIG. 1. It should be noted that the amplitude of the multilevel signal has been made to have a minimum value of zero by the differentiation unit 33.

The multilevel restoration unit 37 compares the multilevel signal reversed by the differentiation unit 33 with each threshold received from the threshold calculator 36. Then the multilevel restoration unit 37 obtains information indicating H state and L state, included in the multilevel signal, depending on whether the electric current of the multilevel signal output from the differentiation unit 33 is greater than the thresholds, and reconstructs the received data D0 and D1 included in the multilevel signal.

The sampling timing generator 38 generates a timing signal of a fixed period based on the received data D0, as in the sampling timing generator 27 described with FIG. 4. The timing signal is output to the maximum value detector/holding unit 35.

Now, reconstruction of received data from a multilevel signal will be described with reference to views of signal waveforms.

Figure 7:
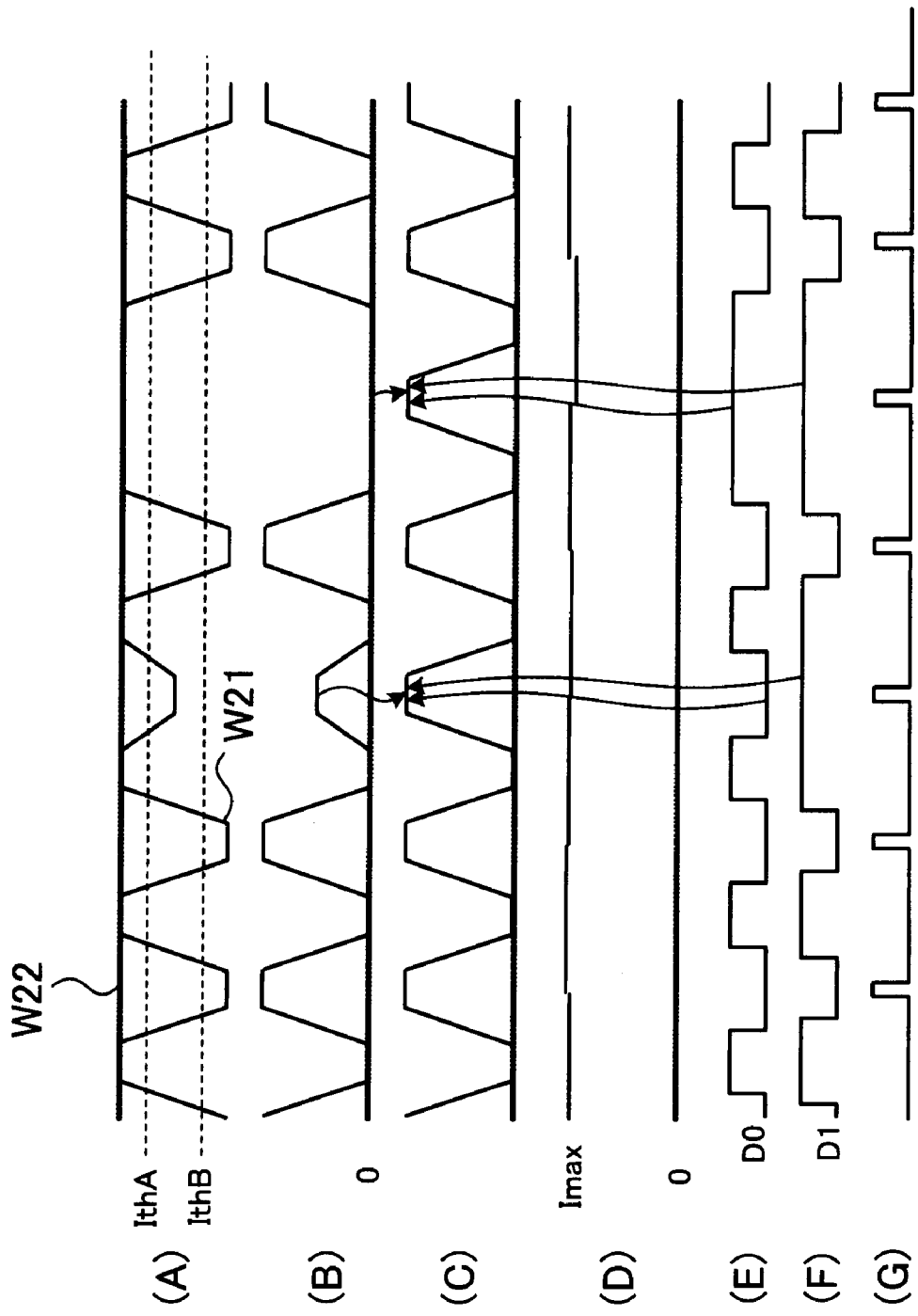
[FIG. 7] Views for explaining how to reconstruct received data from a multilevel signal.

FIG. 7 is views for explaining how to reconstruct received data from a multilevel signal. A waveform W21 of the figure (A) is a waveform of a three-level signal output from the wave detector 21. In the case of three-level signal, there is an intermediate level in addition to levels corresponding to H state and L state, as shown in this figure. In addition, a waveform W22 of the figure (A) shows the maximum value of the amplitude of the multilevel signal. That is, the maximum value detector/holding unit 32 holds the electric current value shown by the waveform W22 and outputs the same to the differentiation unit 33. The figure (B) shows electric current output from the differentiation unit 33. The differentiation unit 33 outputs the electric current obtained by subtracting the multilevel signal from the maximum value output from the maximum value detector/holding unit 32, in which the electric current has a minimum value of zero and is a reversed signal of the multilevel signal, as shown in this figure. The figure (C) shows a binarized multilevel signal output from the amplitude binarization unit 34. The figure (D) shows zero that is the minimum current value of the binarized multilevel signal and the maximum current Imax held by the maximum value detector/holding unit 35. The figure (E) shows received data D0 output from the multilevel restoration unit 37. The figure (F) shows received data D1 output from the multilevel restoration unit 37. The figure (G) shows a timing signal output from the sampling timing generator 38.

From the wave detector 31 of FIG. 6, the multilevel signal shown by the waveform W21 of the figure (A) is output. The maximum value detector/holding unit 32 holds the maximum value of the multilevel signal received from the wave detector 31, which is shown by the waveform W22 of the figure (A), and outputs it to the differentiation unit 33.

The differentiation unit 33 subtracts the multilevel signal from the maximum value held by the maximum value detector/holding unit 32, and outputs a multilevel signal which has a minimum value of zero and has a reversed waveform, which is shown in the figure (B).

The amplitude binarization unit 34 binarizes the multilevel signal received from the differentiation unit 33, and outputs the resultant to the maximum value detector/holding unit 35, which is shown in the figure (C). In order to obtain the maximum value of the amplitude from intermediate level, a doubled value of the intermediate level is taken as the maximum value, for example. In addition, in order to obtain the maximum value of the amplitude from the minimum value, a predetermined value is added to the minimum value and its result is taken as the maximum value, for example. By setting the minimum level to zero in this way, the binarization process is simplified.

The maximum value detector/holding unit 35 holds the maximum value (electric current Imax) of the binarized multilevel signal, which is shown in the figure (D), and outputs it to the threshold calculator 36, in accordance with the timing signal coming from the sampling timing generator 38 shown in the figure (G).

The threshold calculator 36 calculates thresholds IthA and IthB, which are shown in the figure (A), from the maximum value of the amplitude of the multilevel signal received from the maximum value detector/holding unit 35. It should be noted that, since it is known that the minimum value of the amplitude is zero, the thresholds IthA and IthB can be easily calculated only from the maximum value of the amplitude.

The multilevel restoration unit 37 compares the threshold IthA received from the threshold calculator 36 with the multilevel signal, and outputs the received data D0 shown in the figure (E). In addition, the multilevel restoration unit 37 compares the threshold IthB received from the threshold calculator 36 with the multilevel signal, and outputs the received data D1 shown in the figure (F).

As described above, the minimum value of the multilevel signal, that is, a standard level is set to 0, so that the signal processing to be performed by a circuit of latter stage can be simplified. In addition, the setting of the standard level to zero decreases power consumption.

Now another embodiment of FIG. 8 will be described in detail with reference to accompanying drawings. In another embodiment of FIG. 8, an initial threshold to be used for reconstructing received data from a multilevel signal is determined, and for example, a threshold calculator reconstructs received data by using the initial threshold when the demodulation circuit starts to operate.

Figure 8:
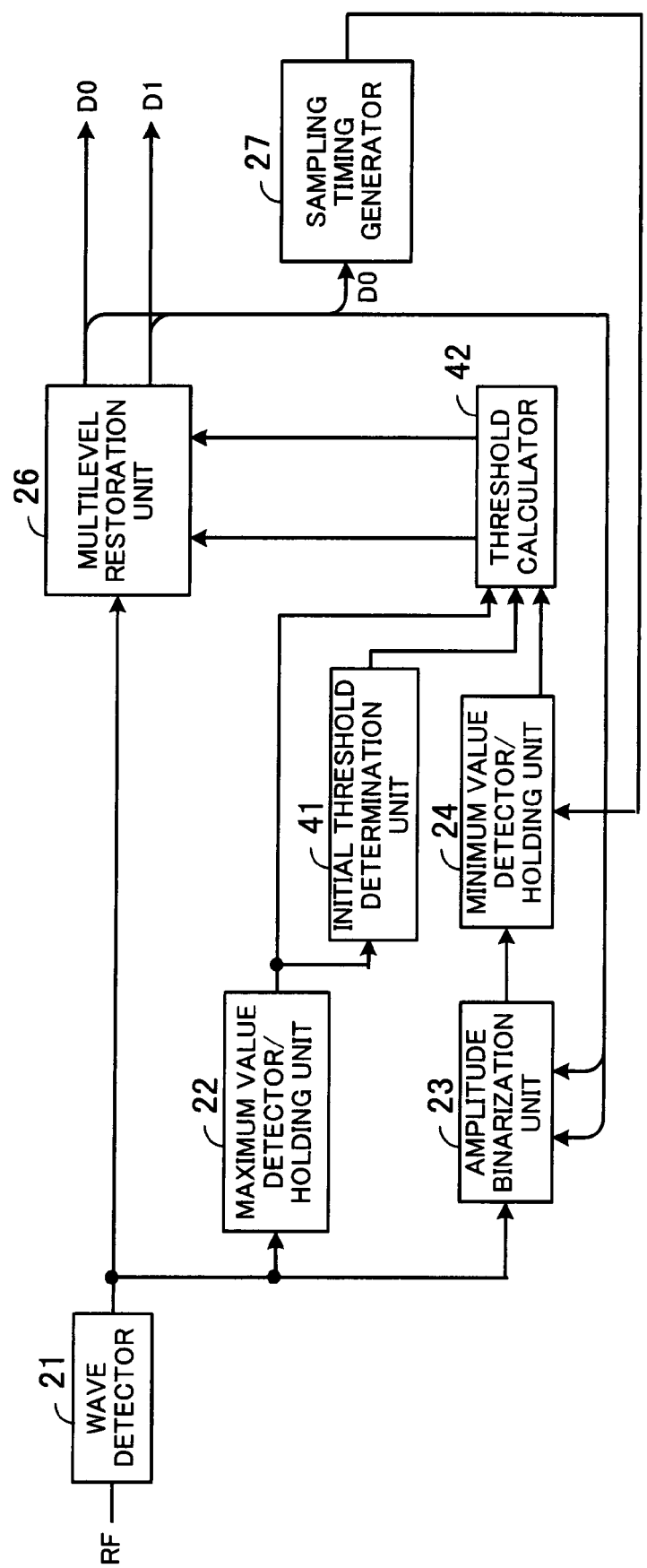
[FIG. 8] A block diagram of a configuration of a demodulation circuit according to another embodiment.

FIG. 8 is a block diagram of a configuration of a demodulation circuit according to another embodiment of FIG. 8. The same reference numerals as FIG. 4 are given to the same components of FIG. 8 and explanation of them will be omitted.

A multilevel signal output from a wave detector 21 continues its peak current before signal transmission starts, as described with FIG. 2. Then the signal becomes a signal including information. An initial threshold determination unit 41 calculates an initial threshold based on the first peak current, and outputs it to the threshold calculator 42.

The initial threshold determination unit 41 sets predetermined times peak current as a threshold. Consider a case of a binary signal. If it is determined that a value equal to or lower than an electric current value obtained by multiplying the peak current by 0.7 indicates L state, a threshold can be determined by multiplying the peak current by 0.85. That is, a value greater than an electric current value obtained by multiplying the peak current by 0.85 indicates H state, while a value equal to or lower than the electric current value indicates L state. Similarly, for a three-level signal, an initial threshold can be determined from the peak current.

The threshold calculator 42 outputs the threshold calculated by the initial threshold determination unit 41 to the multilevel restoration unit 26 when the signal transmission starts. Then the signal transmission starts and when a multilevel signal including information indicating H state and L state is output, the threshold calculator 42 calculates thresholds to be used for reconstructing received data D0 and D1 from the multilevel signal, from the maximum value and the minimum value of the amplitude of the multilevel signal received from the maximum value detector/holding unit 22 and the minimum value detector/holding unit 24, in the same way described with FIG. 4.

By calculating an initial threshold from the peak current when the signal transmission starts as described above, it becomes possible to distinguish, from a signal, noise that is superimposed on the peak current when the signal transmission starts.

Now another embodiment will be described in detail with reference to accompanying drawings. In the restoration circuit of FIG. 4, the minimum value detector/holding unit 24 detects and holds the minimum value of the binarized multilevel signal. Noise superimposed on the multilevel signal may have an influence on the minimum value to be held. For this case, another embodiment of FIG. 4 enables decrease of an influence of noise on the minimum value. In another embodiment of FIG. 4, another function is added to the minimum value detector/holding unit 24 of FIG. 4 and the other components are identical. Therefore, a block diagram of a configuration is not provided and its description is made with reference to FIG. 4.

A minimum value detector/holding unit 24 is designed to output 50% of a change in minimum value of the multilevel signal, the minimum value varying due to noise. That is, the minimum value detector/holding unit 24 multiplies the change in the minimum value of the multilevel signal caused by the noise (change between a previous minimum value and a current minimum value) by a coefficient (a value of one or lower), to thereby suppress the influence of the noise.

Now, reconstruction of received data from a multilevel signal will be described with reference to views of signal waveforms.

Figure 9:
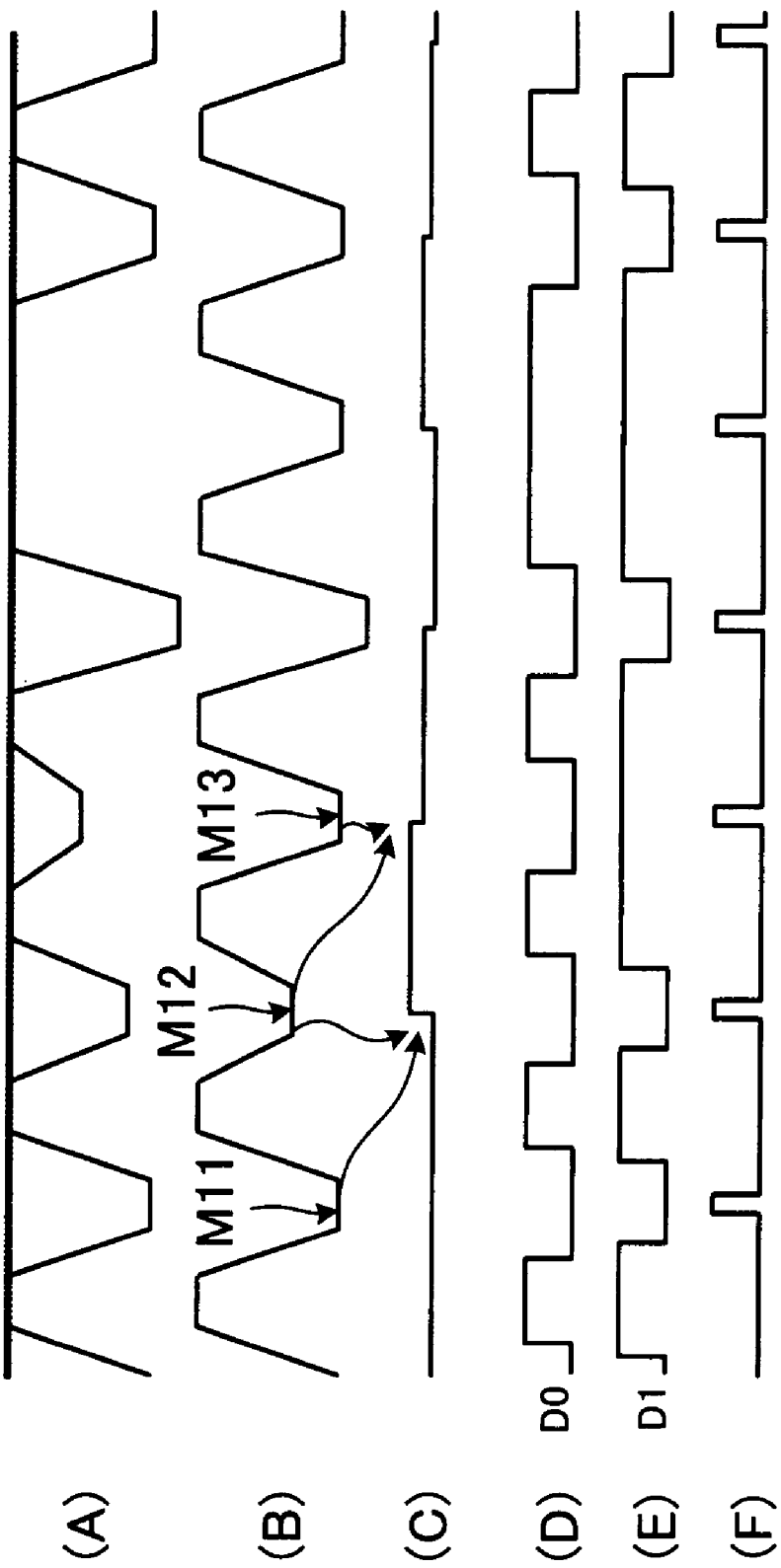
[FIG. 9] Views for explaining how to reconstruct received data from a multilevel signal.
Figure 10:
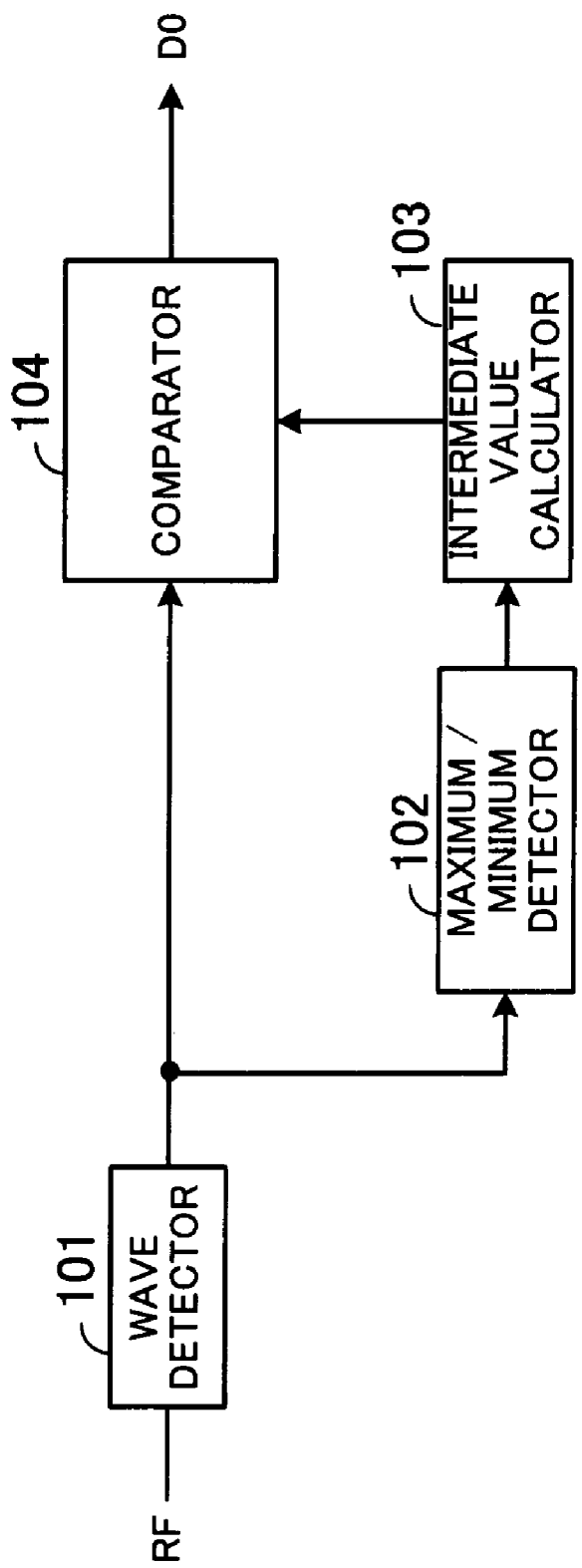
[FIG. 10] A view showing circuit blocks of a demodulation circuit that is used in a non-contact data carrier.

FIG. 9 is views for explaining how to reconstruct received data from a multilevel signal. The figure (A) shows a waveform of a three-level signal output from the wave detector 21 of FIG. 4. In the case of three-level signal, there is an intermediate level in addition to levels corresponding to H state and L state. In addition, noise is superimposed on a multilevel signal, and therefore its minimum value varies as shown in this figure the figure (B) shows a waveform obtained by binarizing the multilevel signal of the figure (A) into an amplitude of a maximum value and a minimum value. That is, this figure shows the electric current value that is output from an amplitude binarization unit 23. Since the minimum value of the multilevel signal varies due to noise as described above, the minimum value of the binarized multilevel signal varies as well.

The figure (C) shows the minimum value held and output by the minimum value detector/holding unit 24. The minimum value detector/holding unit 24 of another embodiment of FIG. 4 outputs 50% of a change in minimum value of the binarized multilevel signal. For example, 50% of a change between the minimum values M11 and M12 shown in the figure (B) is output as shown in the figure (C). In addition, 50% of a change between the minimum values M12 and M13 is output as shown in the figure (C).

The figure (D) shows received data D0 output from a multilevel restoration unit 26. The figure (E) shows received data D1 output from the multilevel restoration unit 26. The figure (F) shows a timing signal output from a sampling timing generator 27.

As described above, by suppressing an influence of noise superimposed on the minimum value of a binarized multilevel signal, appropriate thresholds can be calculated.

It should be noted that the above noise suppression can be applied to another embodiment of FIG. 6. That is, similarly to the above minimum value detector/holding unit 24, the maximum value detector/holding unit 35 of FIG. 6 may multiply a change in maximum value of a multilevel signal which is caused due to noise, by a coefficient, thereby suppressing an influence of the noise.

The foregoing is considered as illustrative only of the principle of the embodiment. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is

1. A demodulation circuit restoring a multilevel signal received on radio, comprising:
    an amplitude detector detecting a maximum value and a minimum value of an amplitude of the multilevel signal;
    a threshold calculator calculating a plurality of thresholds to be used for determining whether a logic state of the multilevel signal is H state or L state, from the maximum value and the minimum value; and
    a multilevel restoration unit comparing the multilevel signal with each of the thresholds to detect the H state and the L state, and reconstructing a plurality of received data;
    wherein the amplitude detector comprises,
    a maximum value detector detecting the maximum value of the multilevel signal;
    an amplitude binarization unit binarizing the amplitude of the multilevel signal into the maximum value and the minimum value; and
    a minimum value detector detecting the minimum value from the binarized multilevel signal.

2. The demodulation circuit according to claim 1, wherein the threshold calculator calculates the thresholds so that the amplitude of the multilevel signal is divided into N (N is a positive integral number of three or greater).

3. The demodulation circuit according to claim 1, wherein the minimum value detector outputs a value obtained by multiplying by a prescribed coefficient a difference between the minimum value detected last and the minimum value detected this time.

4. The demodulation circuit according to claim 1, further comprising an initial threshold determination unit calculating an initial threshold from peak current of the multilevel signal detected before signal transmission starts.

5. The demodulation circuit according to claim 1, wherein the H state and the L states are determined based on whether the detected signal is greater than a threshold value.

6. A demodulation circuit restoring a multilevel signal received on radio, comprising:
    a first maximum value detector detecting a maximum value of the multilevel signal;
    a multilevel signal subtraction unit subtracting the multilevel signal from the maximum value and outputting a reversed signal;
    an amplitude binarization unit binarizing an amplitude of the reversed signal into a maximum value and a minimum value;
    a second maximum value detector detecting the maximum value of the reversed signal binarized;
    a threshold calculator calculating a plurality of thresholds to be used for determining a logic state of reversed signal binarized is H state or L state, from the maximum value detected by the second maximum value detector; and
    a multilevel restoration unit comparing the reversed signal with each of the thresholds to detect the H state and the L state, and reconstructing a plurality of received data.

7. The demodulation circuit according to claim 6, wherein the threshold calculator calculates the thresholds so that the amplitude reversed signal binarized is divided into N (N is a positive integral number of 3 or greater).

8. The demodulation circuit according to claim 6, wherein the second maximum value detector outputs a value obtained by multiplying by a prescribed coefficient a difference between the maximum value detected last and the maximum value detected this time.

9. An electronic device receiving on radio and restoring a multilevel signal, comprising:
    an amplitude detector detecting a maximum value and a minimum value of an amplitude of the multilevel signal;
    a threshold calculator calculating a plurality of thresholds to be used for determining whether a logic state of the multilevel signal is H state or L state, from the maximum value and the minimum value; and
    a multilevel restoration unit comparing the multilevel signal with each of the thresholds to detect the H state and the L state, and reconstructing a plurality of received data;
    wherein the amplitude detector comprises,
    a maximum value detector detecting the maximum value of the multilevel signal;
    an amplitude binarization unit binarizing the amplitude of the multilevel signal into the maximum value and the minimum value; and
    a minimum value detector detecting the minimum value from the binarized multilevel signal.

10. An electronic device receiving on radio and restoring a multilevel signal, comprising:
    a first maximum value detector detecting a maximum value of the multilevel signal;
    a multilevel signal subtraction unit subtracting the multilevel signal from the maximum value and outputting a reversed signal;
    an amplitude binarization unit binarizing an amplitude of the reversed signal into a maximum value and a minimum value;
    a second maximum value detector detecting the maximum value of the reversed signal binarized;
    a threshold calculator calculating a plurality of thresholds to be used for determining a logic state of reversed signal binarized is H state or L state, from the maximum value detected by the second maximum value detector; and
    a multilevel restoration unit comparing the reversed signal with each of the thresholds to detect the H state and the L state, and reconstructing a plurality of received data.

11. A demodulation circuit for a non-contact data carrier restoring a multilevel signal received on radio and obtaining electric power from received radio wave energy, comprising:
    an amplitude detector detecting a maximum value and a minimum value of an amplitude of the multilevel signal;
    a threshold calculator calculating a plurality of thresholds to be used for determining whether a logic state of the multilevel signal is H state or L state, from the maximum value and the minimum value; and a multilevel restoration unit comparing the multilevel signal with each of the thresholds to detect the H state and the L state, and reconstructing a plurality of received data;

wherein the amplitude detector comprises:

a maximum value detector detecting the maximum value of the multilevel signal;

an amplitude binarization unit binarizing the amplitude of the multilevel signal into the maximum value and the minimum value; and a minimum value detector detecting the minimum value from the binarized multilevel signal.

12. The demodulation circuit according to claim 11, wherein the threshold calculator calculates the thresholds so that the amplitude of the multilevel signal is divided into N, wherein N is a positive integral number greater than or equal to three.

13. The demodulation circuit according to claim 11, wherein the minimum value detector outputs a value obtained by multiplying by a prescribed coefficient a difference between the minimum value detected and the preceding minimum value detected.

14. The demodulation circuit according to claim 11, further comprising an initial threshold determination unit calculating an initial threshold from peak current of the multilevel signal detected before signal transmission starts.

15. A demodulation circuit for a non-contact data carrier restoring a multilevel signal received on radio and obtaining electric power from received radio wave energy, comprising:

a first maximum value detector detecting a maximum value of the multilevel signal;

a multilevel signal subtraction unit subtracting the multilevel signal from the maximum value and outputting a reversed signal;

an amplitude binarization unit binarizing an amplitude of the reversed signal into a maximum value and a minimum value;

a second maximum value detector detecting the maximum value of the binarized reversed signal;

a threshold calculator calculating a plurality of thresholds to be used for determining a logic state of binarized reversed signal is H state or L state, from the maximum value detected by the second maximum value detector; and a multilevel restoration unit comparing the reversed signal with each of the thresholds to detect the H state and the L state, and reconstructing a plurality of received data.

16. The demodulation circuit according to claim 15, wherein the threshold calculator calculates the thresholds so that the amplitude of the reversed signal is divided into N, wherein N is a positive integral number greater than or equal to three.

17. The demodulation circuit according to claim 15, wherein the second maximum value detector outputs a value obtained by multiplying by a prescribed coefficient a difference between the maximum value detected last and the maximum value detected this time.

18. An electronic device restoring a multilevel signal received on radio and obtaining electric power from received radio wave energy, comprising:

an amplitude detector detecting a maximum value and a minimum value of an amplitude of the multilevel signal;

a threshold calculator calculating a plurality of thresholds to be used for determining whether a logic state of the multilevel signal is H state or L state, from the maximum value and the minimum value; and a multilevel restoration unit comparing the multilevel signal with each of the thresholds to detect the H state and the L state, and reconstructing a plurality of received data;

wherein the amplitude detector comprises, a maximum value detector detecting the maximum value of the multilevel signal;

an amplitude binarization unit binarizing the amplitude of the multilevel signal into the maximum value and the minimum value; and a minimum value detector detecting the minimum value from the binarized multilevel signal.

19. An electronic device restoring a multilevel signal received on radio and obtaining electric power from received radio wave energy, comprising:

a first maximum value detector detecting a maximum value of the multilevel signal;

a multilevel signal subtraction unit subtracting the multilevel signal from the maximum value and outputting a reversed signal;

an amplitude binarization unit binarizing an amplitude of the reversed signal into a maximum value and a minimum value;

a second maximum value detector detecting the maximum value of the binarized reversed signal;

a threshold calculator calculating a plurality of thresholds to be used for determining whether a logic state of binarized reversed signal is H state or L state, from the maximum value detected by the second maximum value detector; and a multilevel restoration unit comparing the reversed signal with each of the thresholds to detect the H state and the L state, and reconstructing a plurality of received data.

* * * * *